United States Patent
Srivastava et al.

(10) Patent No.: US 11,657,238 B2
(45) Date of Patent: May 23, 2023

(54) LOW-POWER COMPUTE-IN-MEMORY BITCELL

(71) Applicant: QUALCOMM Incorporated, San Diego, CA (US)

(72) Inventors: Ankit Srivastava, San Diego, CA (US); Seyed Arash Mirhaj, San Diego, CA (US); Guoqing Miao, San Diego, CA (US); Seyfi Bazarjani, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 533 days.

(21) Appl. No.: 16/779,491

(22) Filed: Jan. 31, 2020

(65) Prior Publication Data

US 2021/0240442 A1     Aug. 5, 2021

(51) Int. Cl.
| | | |
|---|---|---|
| *G06G 7/12* | (2006.01) | |
| *G11C 11/412* | (2006.01) | |
| *G11C 11/419* | (2006.01) | |
| *G06G 7/16* | (2006.01) | |

(52) U.S. Cl.
CPC .............. *G06G 7/12* (2013.01); *G11C 11/412* (2013.01); *G11C 11/419* (2013.01); *G06G 7/16* (2013.01)

(58) Field of Classification Search
CPC ........ G06G 7/12; G06G 7/16; G06F 15/7821; G06F 15/785; G11C 7/1006; G11C 7/12; G11C 7/16; G11C 8/16
See application file for complete search history.

(56) References Cited

U.S. PATENT DOCUMENTS

| | | | |
|---|---|---|---|
| 10,304,525 B2 | 5/2019 | Mohammadi et al. | |
| 10,825,510 B2* | 11/2020 | Jaiswal | G11C 11/412 |
| 11,355,167 B2* | 6/2022 | Seok | G11C 15/043 |
| 2010/0271144 A1* | 10/2010 | McCorquodale | H03B 5/04 |
| | | | 331/117 FE |
| 2014/0362636 A1* | 12/2014 | Erickson | G11C 5/005 |
| | | | 365/149 |
| 2018/0315473 A1* | 11/2018 | Yu | G06N 3/063 |
| 2019/0042199 A1 | 2/2019 | Sumbul et al. | |
| 2019/0080231 A1 | 3/2019 | Nestler et al. | |

(Continued)

FOREIGN PATENT DOCUMENTS

| | | |
|---|---|---|
| EP | 0354265 B1 | 12/1993 |
| JP | 2001053164 A | 2/2001 |
| WO | WO-2019246064 A1 * | 12/2019 ......... G06F 12/0207 |

OTHER PUBLICATIONS

S. Yin, Z. Jiang, J. -S. Seo and M. Seok, "XNOR-SRAM: In-Memory Computing SRAM Macro for Binary/Ternary Deep Neural Networks," in IEEE Journal of Solid-State Circuits, vol. 55, No. 6, pp. 1733-1743, Jun. 2020, doi: 10.1109/JSSC.2019.2963616. (Year: 2020).*

(Continued)

*Primary Examiner* — Jyoti Mehta
*Assistant Examiner* — Huy Duong
(74) *Attorney, Agent, or Firm* — Qualcomm Incorporated

(57) ABSTRACT

A compute-in-memory bitcell is provided that includes a pair of cross-coupled inverter for storing a stored bit. The compute-in-memory bitcell includes a logic gate for multiplying the stored bit with an input vector bit. An output node for the logic gate connects to a second plate of a capacitor. A first plate of the capacitor connects to a read bit line.

20 Claims, 8 Drawing Sheets

(56) References Cited

U.S. PATENT DOCUMENTS

2019/0088309 A1* 3/2019 Li .................. G11C 7/1006
2019/0103156 A1 4/2019 Sumbul et al.
2021/0327474 A1* 10/2021 Seok ............... G11C 7/1006
2021/0383881 A1* 12/2021 Onuki ............. G11C 16/3459

OTHER PUBLICATIONS

Chiu, Po-Yen, and Ming-Dou Ker. "Metal-Layer Capacitors in the 65  Nm CMOS Process and the Application for Low-Leakage Power-Rail ESD Clamp Circuit." Microelectronics Reliability, Pergamon, Sep. 21, 2013, https://www.sciencedirect.com/science/article/pii/S0026271413003223. (Year: 2013).*
International Search Report and Written Opinion—PCT/US2021/014452—ISA/EPO—dated Apr. 30, 2021.

* cited by examiner

LOW-POWER COMPUTE-IN-MEMORY BITCELL

TECHNICAL FIELD

This application relates to compute-in-memories, and more particularly to a low-power compute-in-memory bitcell.

BACKGROUND

Computer processing of data typically uses a Von Neumann architecture in which the data is retrieved from a memory to be processed in an arithmetic and logic unit. In computation-intensive applications such as machine learning, the data flow from and to the memory becomes a bottleneck for processing speed. To address this data-movement bottleneck, compute-in-memory architectures have been developed in which the data processing hardware is distributed across the bitcells.

SUMMARY

In accordance with a first aspect of the disclosure, a compute-in-memory storage cell is provided that includes: a pair of cross-coupled inverters having a first output node for a stored bit; a read bit line; a word line having a voltage responsive to an input bit; a capacitor having a first plate connected to the read bit line; and a first pass transistor connected between the first output node and a second plate of the capacitor and having a gate connected to the word line.

In accordance with a second aspect of the disclosure, a compute-in-memory storage cell is provided that includes: a pair of cross-coupled inverters having a first output node for a stored bit; a read bit line; a capacitor having a first plate connected to the read bit line; and a first transmission gate connected between the first output node and a second plate of the capacitor, wherein the first transmission gate is configured to close in response to an input bit being true and is configured to open in response to the input bit being false.

In accordance with a third aspect of the disclosure, a multiply-and-accumulate circuit is provided that includes: a plurality of compute-in-memory storage cells arranged into a plurality of columns, wherein each column includes a read bit line, and wherein each compute-in-memory storage cell in each column includes a logic gate configured to multiply an input bit with a stored bit and includes a capacitor having a first plate connected to the column's read bit line and having a second plate connected to an output node for the logic gate.

In accordance with a fourth aspect of the disclosure, a compute-in-memory method is provided that includes: during a reset phase, charging a read bit line for a column of compute-in-memory storage cells to a power supply voltage while a first plate for a capacitor in each compute-in-memory storage cell is connected to the read bit line and while a second plate for each capacitor in each compute-in-memory storage cell is grounded; during a calculation phase following the reset phase in each compute-in-memory storage cell, multiplying a corresponding bit of an input vector with a stored bit for the compute-in-memory storage cell to drive the second plate of the compute-in-memory storage cell's capacitor with a multiplication signal while the read bit line remains charged to the power supply voltage; and during an accumulation phase following the calculation phase, isolating the read bit line from a power supply node for the power supply voltage while the second plate of each compute-in-memory storage cell's capacitor is grounded to develop an accumulation voltage on the read bit line.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
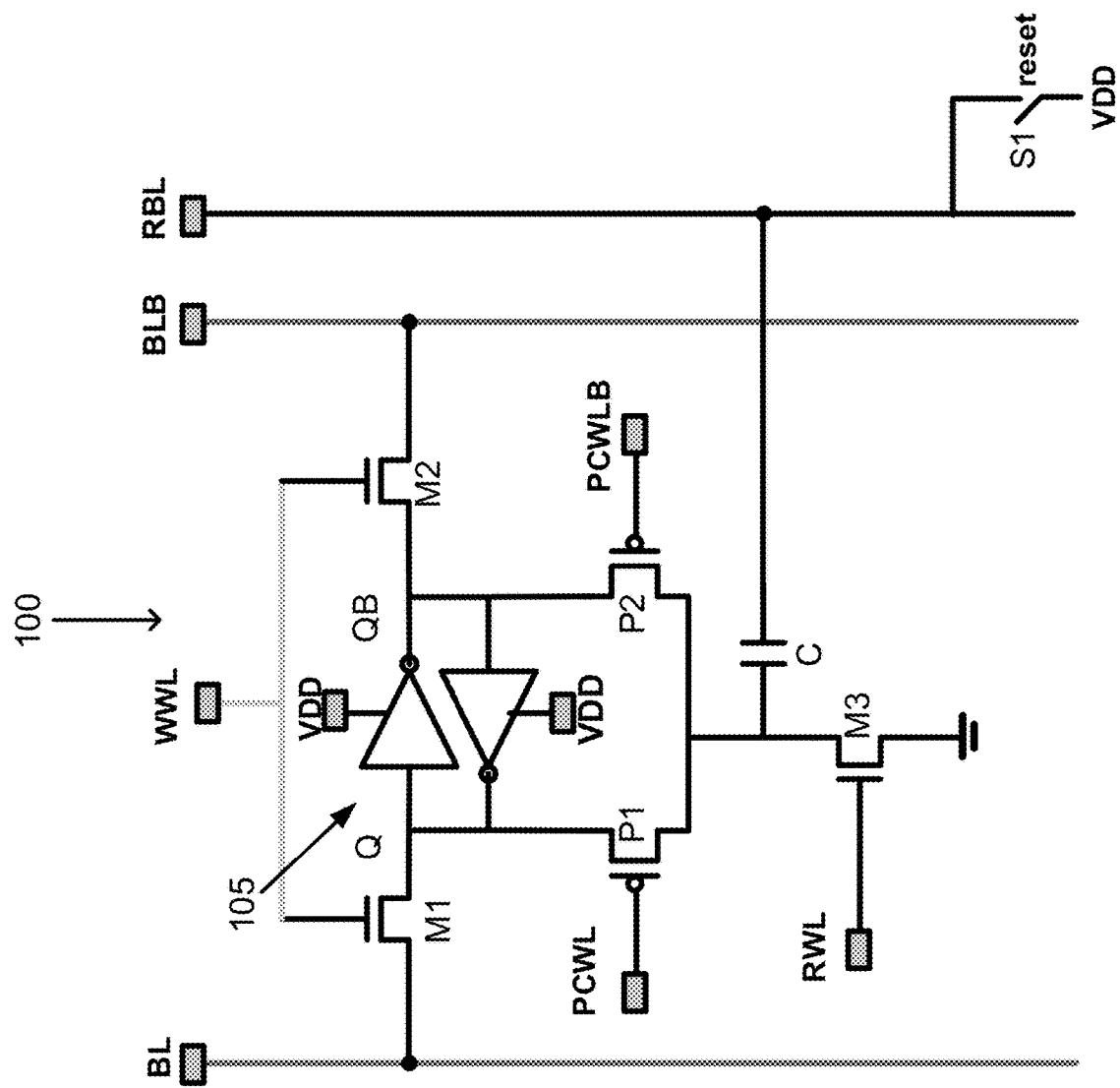
FIG. 1 illustrates a first compute-in-memory bitcell in accordance with an aspect of the disclosure.

A compute-in-memory storage cell such as a compute-in-memory bitcell is provided that includes an SRAM cell that stores a bit using two cross-coupled inverters. One of the cross-coupled inverters drives a true (Q) output node with the stored bit whereas the remaining cross-coupled inverter drives a complement (QB) output node with a complement of the stored bit. The compute-in-memory bitcells also includes a capacitor having a first plate connected to a read bit line (RBL). As used herein, "connected" refers to a direct electrical connection although such a direct connection may be accomplished through an intervening element such as a resistor, a capacitor, or an inductor. The Q output node couples to a second plate of the capacitor through a first pass transistor such as a p-type metal-oxide semiconductor (PMOS) first pass transistor. Similarly, the QB output node couples to the second plate of the capacitor through a second pass transistor such as a PMOS second pass transistor. The Q output node is also denoted herein as a first output node. Similarly, the QB output node is also denoted herein as a second output node. An input vector bit controls the gate of the first pass transistor whereas a complement of the input vector bit controls the gate of the second pass transistor.

The second plate for the capacitor couples to ground through a reset transistor such as an n-type metal-oxide semiconductor (NMOS) reset transistor having a gate controlled by a read word line (RWL). During a reset phase for the compute-in-memory bitcells, the read bit line is charged high to a power supply voltage VDD while the read word line is asserted to the power supply voltage VDD to charge the capacitor. During a calculation phase following the reset phase, the read word line is discharged to switch off the reset transistor while the read bit line remains charged to the power supply voltage VDD. If the input vector bit and the stored bit are both true, the first pass transistor is switched on to charge the second plate of the capacitor to the power supply voltage VDD. Similarly, if the input vector bit and the store bit are both false, the second pass transistor is switched on to charge the second plate of the capacitor. Since the first plate of the capacitor remains connected to a power supply node for the power supply voltage VDD during the calculation phase, the charging of the second plate to the power supply voltage VDD discharges the capacitor. On the other hand, if the input vector bit and the stored bit have complementary values, neither the first pass transistor nor the second pass transistor is switched on during the calculation phase. In that case, the second plate of the capacitor remains discharged so that the capacitor remains charged to the power supply voltage VDD.

Should the input vector bit be an active-low signal, the compute-in-memory cell is implementing an exclusive not-OR (XNOR) of the input vector bit and the stored bit during the calculation phase in that a logical true output (capacitor charged) is obtained if both the input vector bit and the stored bit have the same binary value whereas a logical false output (capacitor discharged) is obtained if the input vector bit and the stored bit do not have the same binary value. If the input vector bit was instead an active-high signal, the compute-in-memory bitell would implement an exclusive-OR (XOR) of the stored bit and the input vector bit.

The resulting compute-in-memory bitcell is quite advantageous since the resulting charging of the capacitor is full-rail (i.e, either charged to the power supply voltage VDD or discharged to ground). In addition, a transmission gate is not required to pass the full-rail output. Moreover, the read word line assertion to switch on the reset transistor does not need to be boosted above the power supply voltage VDD for the resulting rail-to-rail output. Finally, the reset transistor as well as the remaining transistors in the compute-in-memory bitcell may all be high-voltage (thick-oxide) transistors to limit leakage. Some example compute-in-memory bitcells will now be discussed in more detail.

Turning now to the drawings, an example compute-in-memory bitcell 100 is shown in FIG. 1. A pair of cross-coupled inverters 105 store a stored bit on a true output node Q and also store a complement of the bit on a complement output node QB. As known in the SRAM arts, the stored bit was written into compute-in-memory bitcell 100 from a bit line BL and a complement bit line BLB when a write word line (WWL) is asserted to a power supply voltage VDD to switch on a corresponding pair of NMOS access transistors M1 and M2. Access transistor M1 is also denoted herein as a first access transistor. Similarly, access transistor M2 is also denoted herein as a second access transistor. The true output node Q connects to a source of a PMOS first pass transistor P1 that has its drain connected to a second plate of a capacitor C and to a drain of an NMOS reset transistor M3. Similarly, the complement output node QB connects to a source of a PMOS second pass transistor P2 that has its drain connected to the second plate of capacitor C and to the drain of reset transistor M3. An active-low input vector bit on a pre-charge word line PCWL controls the gate of first pass transistor P1. Similarly, a complement of the active-low input vector bit on a complement pre-charge word line PCWLB controls the gate of second pass transistor P2. For brevity, the pre-charge word line PCWL is also denoted as just a word line herein.

A first plate of capacitor C connects to a read bit line RBL. Prior to a calculation phase, the capacitor C is reset in a reset phase for compute-in-memory bitcell 100. During the reset phase, a reset signal carried on a reset line is asserted to close a switch S1 connected between the read bit line and a node for the power supply voltage VDD. The read bit line is thus charged to the power supply voltage VDD during the reset phase. While the reset signal is asserted, a read word line is also asserted that connects to a gate of reset transistor M3. A source of reset transistor M3 is connected to ground so that when the read word line is asserted, reset transistor M3 switches on to ground the second plate of capacitor C. The capacitor C is thus charged to the power supply voltage VDD during the reset phase. During the reset phase, both the pre-charge word line and the complement pre-charge word line are charged to the power supply voltage VDD to maintain both pass transistors P1 and P2 off.

In a calculation phase to calculate the binary multiplication of the stored bit and the input vector bit, pre-charge word line and the complement pre-charge word line are charged according to the value of the input vector bit while the reset signal is asserted to keep the read bit line charged to the power supply voltage VDD. The read word line is de-asserted during the calculation phase so that the second plate of the capacitor C floats with respect to ground. In an active-low embodiment, the pre-charge word line is discharged if the input vector bit is true. At the same time, the complement pre-charge word line is then charged high to the power supply voltage VDD. Conversely, if the input vector bit is false in an active-low embodiment, the pre-charge word line is charged to the power supply voltage VDD while the complement pre-charge word line is discharged. If the pre-charge word line is discharged due to the true value of the input vector bit and the stored bit is also true, pass transistor P1 will switch on to charge the second plate of the capacitor C to the power supply voltage VDD. Since the read bit line is connected to the power supply node for the power supply voltage VDD, the capacitor C is thus discharged due to the charging of the second plate. The same discharge for capacitor C occurs when both the stored bit and the input vector bit are false. In that case, second pass transistor P2 switches on to charge the second plate of the capacitor during the calculation phase. But if the input vector bit and the stored bit have complementary binary values, neither of the pass transistors P1 and P2 will switch on. The second plate then stays discharged so that the capacitor C remains charged. The resulting multiplication is thus an XNOR of the input vector bit and the stored bit. On the other hand, the multiplication would an XOR of the input vector bit and the stored bit if the input vector bit is an active-high signal.

An accumulation phase follows the calculation phase. In the accumulation phase, the read word line is asserted while the reset signal is de-asserted. The read bit line is thus isolated during the accumulation phase from the power supply node because switch S1 opens from the de-assertion of the reset signal. The second plate of the capacitor C is grounded during the accumulation phase as reset transistor M3 is switched on due to the assertion of the read word line to the power supply voltage VDD.

Figure 2A:
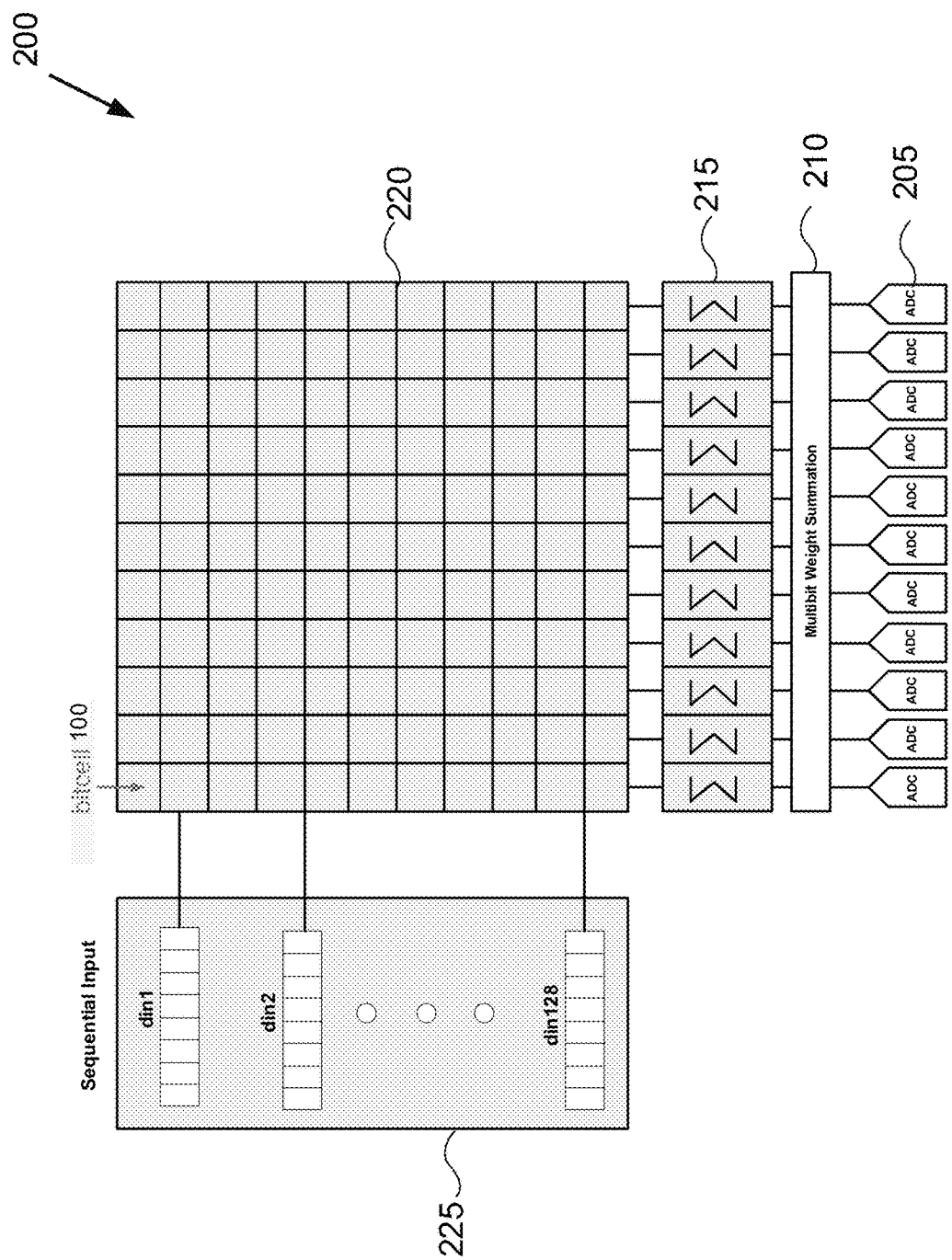
FIG. 2A illustrates a multiply-and-accumulate circuit including an array of compute-in-memory bitcells in accordance with an aspect of the disclosure.

The reset, calculation, and accumulation phases apply across a column of compute-in-memory bitcells in a multiply-and-accumulate circuit as disclosed herein. An example multiply-and-accumulate (MAC) circuit 200 shown in FIG. 2A includes an array 220 of compute-in-memory bitcells 100 arranged in row and columns. The stored bits in array 220 may be considered to form a matrix that is multiplied with an input vector din 225. For example, the dimensionality of input vector din 225 may be one-hundred twenty-eight in MAC circuit 200 such that input vector din 225 ranges from an input vector first bit din1 to a one-hundred-twenty-eighth bit din128. Input vector din 225 changes sequentially so that for each instantiation, the input vector din 225 is multiplied by the matrix stored in array 220 and the result sequentially integrated in sequential integrators 215. To do the matrix multiplication, input vector din 225 is multiplied on a column-by-column basis with the contents of array 220.

Figure 2B:
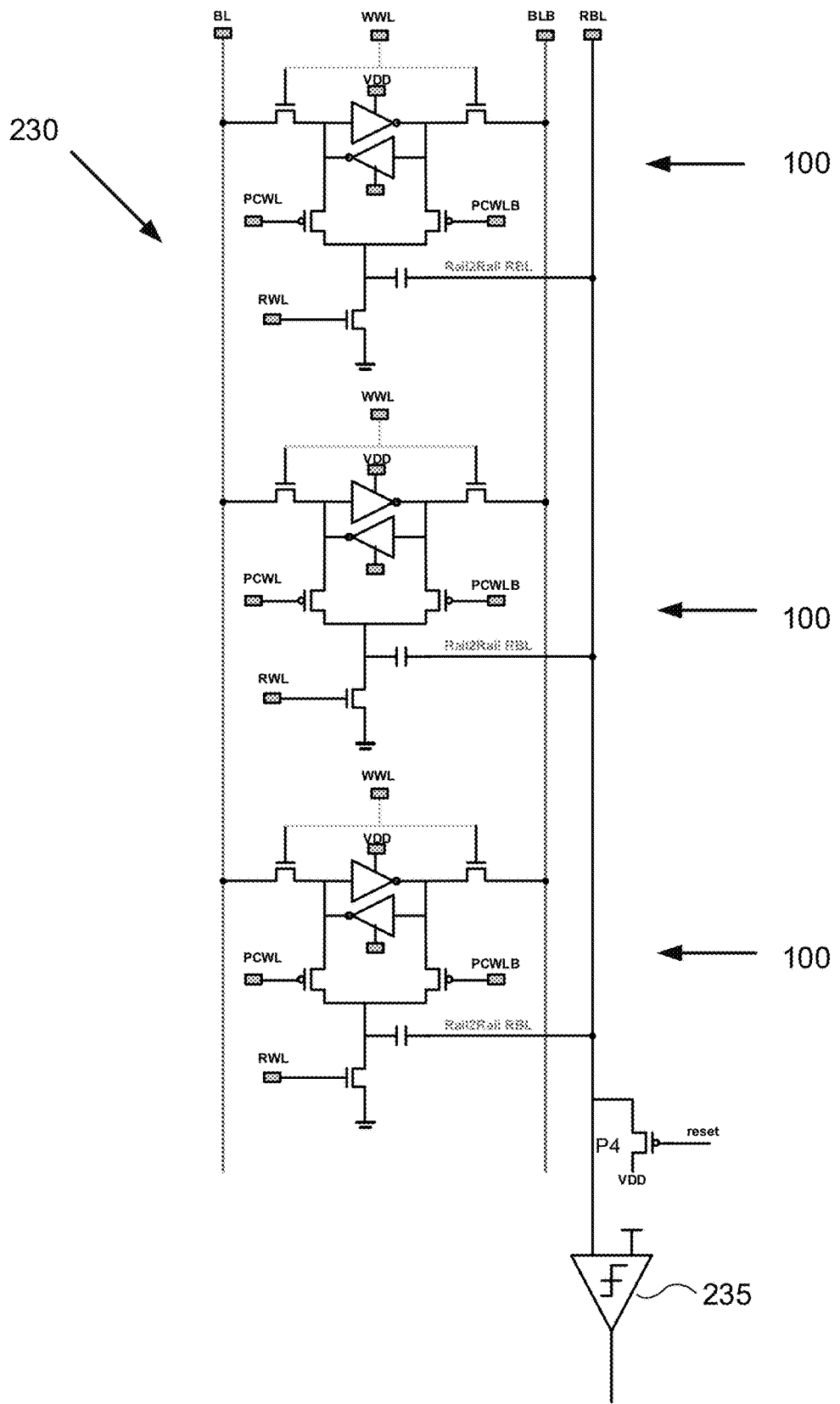
FIG. 2B illustrates a column of compute-in-memory bitcells for a multiply-and-accumulate circuit in accordance with an aspect of the disclosure.

An example column 230 for array 220 is shown in FIG. 2B in more detail. Each row in array 220 is represented by a corresponding compute-in-memory bitcell 100 in column 230. For illustration clarity, only three compute-in-memory bitcells 100 are shown in FIG. 2B but it will be appreciated that there will be a corresponding compute-in-memory bitcell 100 for each row of array 220. Since input vector din 225 has a dimensionality of one-hundred twenty-eight, there are 128 rows in array 220. It will be appreciated that this dimensionality may be varied in alternative embodiments. A compute-in-memory bitcell 100 for the first row in column 230 performs the multiplication of its stored bit with input vector first bit din1. Similarly, a compute-in-memory bitcell 100 for the second row in column 230 may perform the multiplication of its stored bit with input vector second bit din2, and so on such that a compute-in-memory bitcell 100 for the one-hundred-twenty-eighth row in column 230 may perform the multiplication of its stored bit with input vector final bit din128. Each compute-in-memory bitcell 100 in column 230 either maintains the charge of its capacitor or discharges its capacitor depending upon the multiplication result and affects the voltage of the read bit line (RBL) during the accumulation phase accordingly. The read bit line is thus global to all the compute-in-memory bitcells 100 in column 230. Similarly, the bit line (BL) and the complement bit line (BLB) are also global to all the compute-in-memory bitcells 100 in column 230. Switch S1 of FIG. 1 is implemented by a PMOS transistor P4 in column 230. In some embodiments, reset transistor M3 is also denoted herein as a third transistor whereas transistor P4 is also denoted herein as a fourth transistor. In other embodiments, reset transistor M3 is denoted herein as a first transistor whereas transistor P4 is denoted herein as a second transistor.

The voltage on the read bit line for a column 230 in the accumulation phase after multiplication of its stored bits with input vector din 225 represents the analog result of the multiplication of one row of the matrix stored in array 220 with input vector din 225. The read bit line voltage is also denoted herein as an accumulation voltage. To convert this analog result into a digital value, each column 230 includes an analog-to-digital converter (ADC) 205. In column 230, ADC 205 is represented by a comparator 235. In some embodiments, ADC 205 may be a multi-bit ADC that provides a digital result a bit at a time that is summed by a multi-bit summation circuit 210 to provide the multi-bit weight or digital result for the multiplication of the matrix row with input vector din 225. As input vector din 225 is sequentially changed, each instantiation of input vector din 225 is multiplied with the stored bits in each column 230 and the multi-bit result stored in a corresponding sequential integrator 215. There is thus an ADC 205, a multi-bit summation circuit 210, and a sequential integrator 215 for each column 230 on a one-to-one basis in some embodiments. Each sequential integrator 215 sequentially integrates the multiply-and-accumulation result for its column 230 as input vector din 225 is sequentially changed to form a sequential input.

Figure 3:
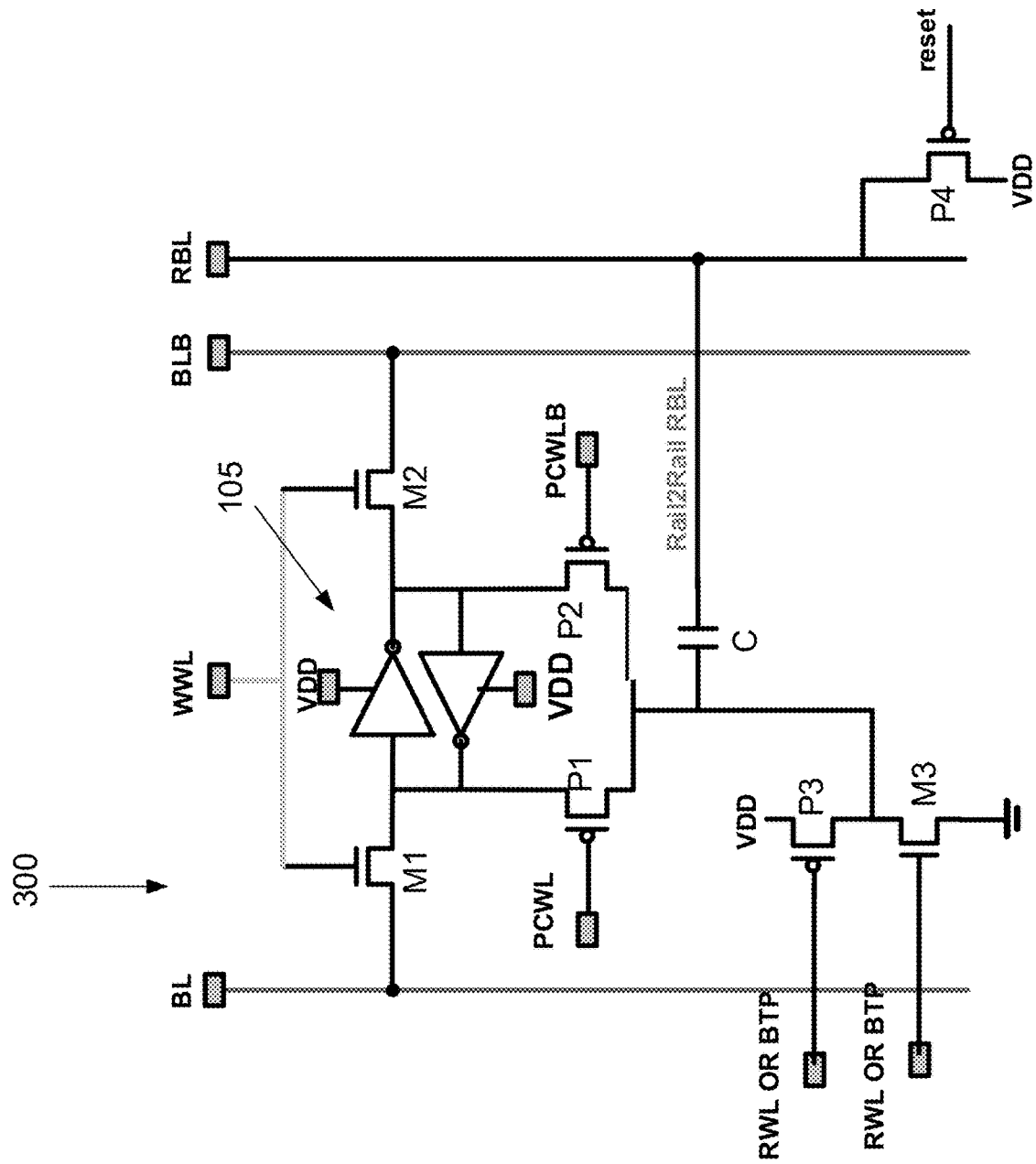
FIG. 3 illustrates a second compute-in-memory bitcell in accordance with an aspect of the disclosure.

The resulting matrix multiplication is quite advantageous in that the linearity of the result substantially depends upon whether the capacitor C for each compute-in-memory bitcell 100 can be reproduced with minimal variation. This is readily achieved in modern semiconductor manufacturing techniques such as by implementing each capacitor C as a metal-layer capacitor so that the multiply-and-accumulate operation is advantageously linear. In alternative embodiments, each capacitor C may be implemented using a varactor, a metal-insulator-metal capacitor, or other suitable structures. The linearity also depends on ADC 205. To reduce the die space required for each ADC 205 and to improve linearity, compute-in-memory bitcell 100 may be modified so that the capacitor C may be used in the operation of ADC 205 as follows. An example modified compute-in-memory bitcell 300 is shown in FIG. 3. Compute-in-memory bitcell 300 is arranged as discussed for compute-in-memory bitcell 100 except that a PMOS transistor P3 is introduced that has a source connected to a power supply node and a drain connected to the second plate of capacitor C. In addition, switch S1 is implemented as PMOS transistor P4 as also shown in FIG. 2B.

The addition of transistor P3 is also advantageous as capacitor C can be reused as part of a capacitor digital-to-analog converter (CDAC) such as in embodiments in which each ADC 205 is a multi-bit successive-approximation-register (SAR) ADC. After a column of compute-in-memory bitcells 300 has charged their read bit line with the result of the multiplication across the column in the accumulation phase, the read word line voltage may be sampled by another capacitor (not illustrated). With the sampled voltage captured by this additional capacitor, the read bit line may then be discharged to ground. The resulting sampled voltage may then be selectively boosted by driving the second plates of selected ones of capacitors C to the power supply voltage VDD by switching on transistors P3 in the selected compute-in-memory bitcells 300 in the column. In particular, a DAC signal BTP such as controlled by a finite state machine (not illustrated) is discharged for the selected compute-in-memory bitcells 300 to boost the sampled voltage from the column multiplication. The remaining compute-in-memory bitcells 300 in the column would float the second plate for their capacitor C so as to not affect the desired boosting. Alternatively, the sampled voltage may be selectively decremented by grounding the second plates of selected ones of capacitors C by switching on reset transistors M3 in the selected compute-in-memory bitcells 300 by asserting their DAC signal BTP. In an embodiment with 128 rows of compute-in-memory bitcells 300, the resulting DAC resolution would be seven bits. In general, the resolution may be increased or decreased by changing the array size for bitcells 300 accordingly.

Figure 4:
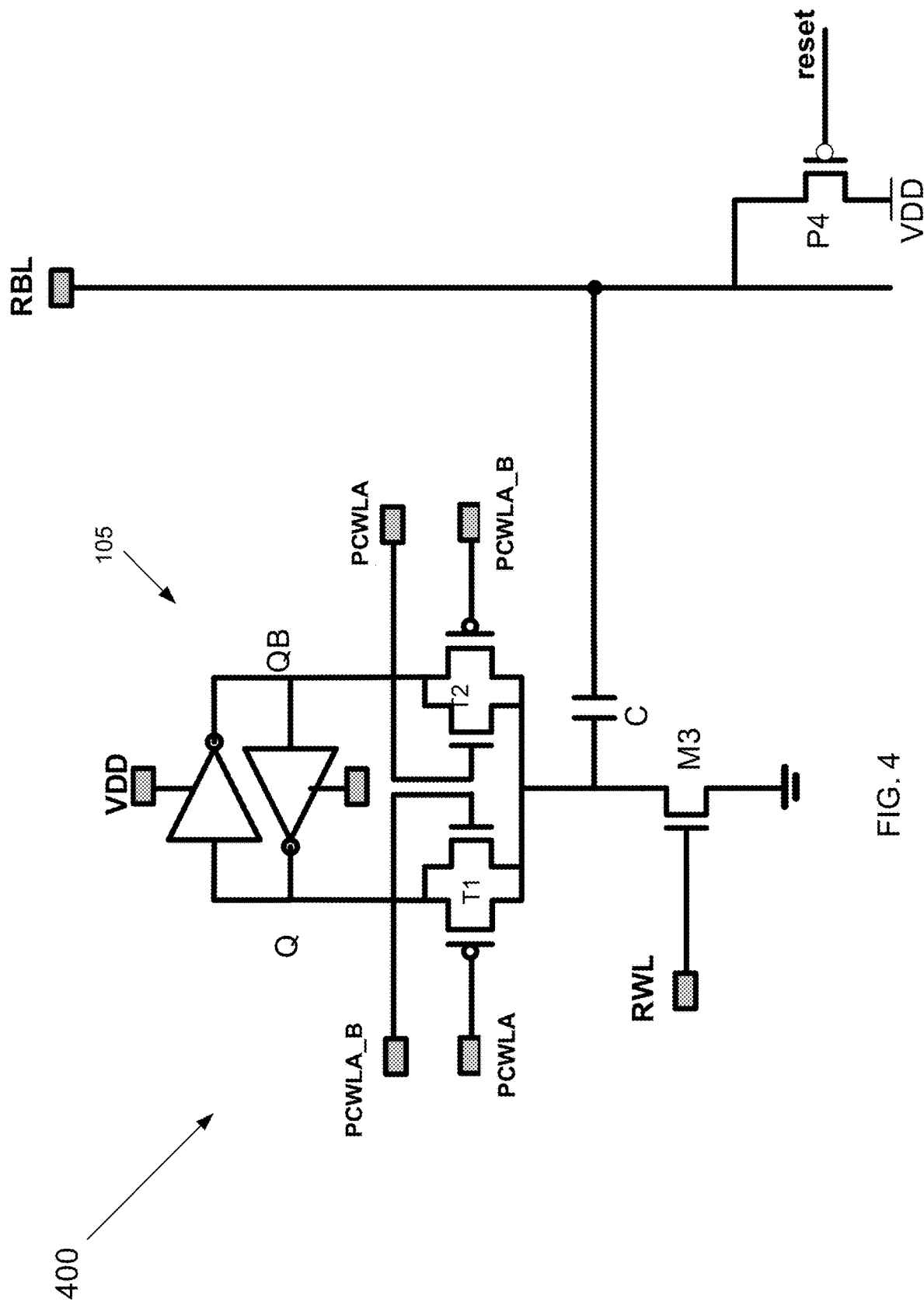
FIG. 4 illustrates a third compute-in-memory bitcell in accordance with an aspect of the disclosure.

Regardless of whether transistor P3 is included or not, the compute-in-memory bitcell multiplication disclosed herein is not limited to the use of pass transistors P1 and P2 to drive the second plate of the corresponding capacitor C. For example, compute-in-memory bitcell 100 may be modified to replace pass transistors P1 and P2 with transmission gates as shown in FIG. 4 for a compute-in-memory bitcell 400. The transmission gates further ensure that a full rail signal (ground or the power supply voltage VDD) is passed to the second plate of capacitor C. In particular, a first transmission gate T1 gates whether the stored bit on the Q output node for cross-coupled inverters 105 may pass to affect the second plate voltage for the capacitor C. Similarly, a second transmission gate T2 gates whether the complement of the stored bit on the QB output node may pass to affect the second plate voltage for the capacitor C. A pre-charge word line PCWLA and a complement pre-charge word line PCWLA_B control whether the transmission gates T1 or T2 are open or closed.

An input bit controls the state of the pre-charge word line PCWLA. Similarly, a complement of the input bit controls the state of the complement pre-charge word line PCWLA_B. First transmission gate T1 is configured so that the first transmission gate T1 closes in response to the (active-low in an XNOR implementation) input bit being true and so that the first transmission gate T1 opens in response to the input bit being false. The input bit (e.g., an input vector bit) may be active-low or active-high depending upon whether an XNOR-based or an XOR-based multiplication is desired. The pre-charge word line PCWLA drives a gate of a PMOS transistor in first transmission gate T1. Similarly, the complement pre-charge word line PCWLA_B drives a gate of an NMOS transistor in first transmission gate T1.

This coupling is reversed in second transmission gate T2 so that it is the complement pre-charge word line PCWLA_B that drives a gate of the PMOS transistor in second transmission gate T2. Similarly, it is the pre-charge word line PCWLA that drives a gate of the NMOS transistor in second transmission gate T2. Second transmission gate T2 is thus configured so that the second transmission gate T2 closes in response to the complement input vector bit being true and so that the second transmission gate opens in response to the complement input vector bit being false. During an evaluation phase in which compute-in-memory bitcell 400 performs the XNOR-based (or XOR-based) multiplication, only one of the transmission gates T1 and T2 will be closed, the other will be open depending upon the binary state of the input bit. The remaining components in compute-in-memory bitcell 400 are as discussed with regard to compute-in-memory bitcell 100. The access transistors M1 and M2, the write word line WWL, and the bit lines BL and BLB are not shown in FIG. 4 for illustration clarity.

Figure 5:
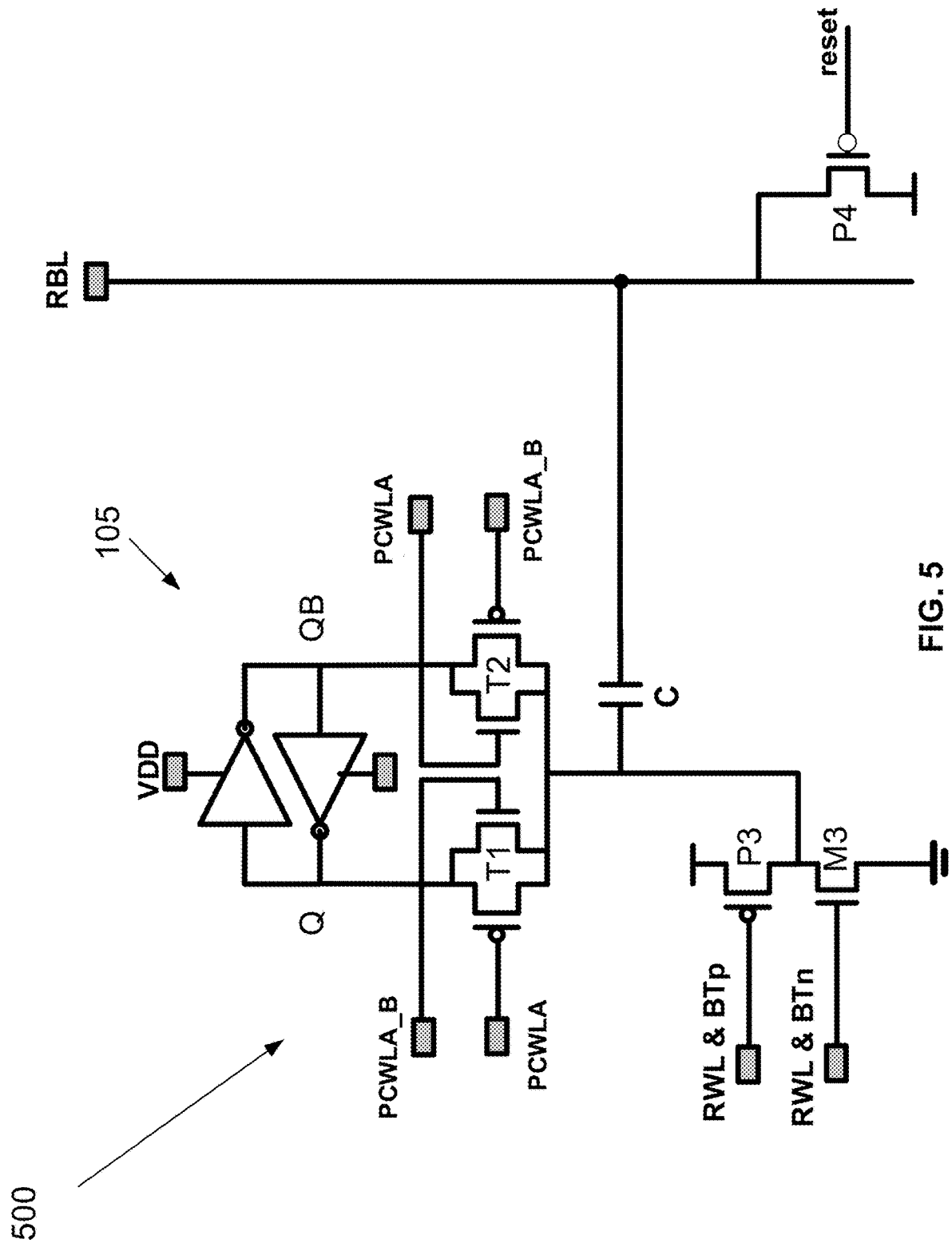
FIG. 5 illustrates a fourth compute-in-memory bitcell in accordance with an aspect of the disclosure.

Compute-in-memory bitcell 300 may also be modified to include first and second transmission gates T1 and T2 as shown for a compute-in-memory bitcell 500 in FIG. 5. The remaining components in compute-in-memory bitcell 500 are as discussed for FIG. 3. The access transistors M1 and M2, the write word line WWL, and the bit lines BL and BLB are not shown in FIG. 5 for illustration clarity. Operation of the first transmission gate T1 and of the second transmission gate T2 in compute-in-memory bitcell 500 is as discussed with regard to compute-in-memory bitcell 400.

Figure 6:
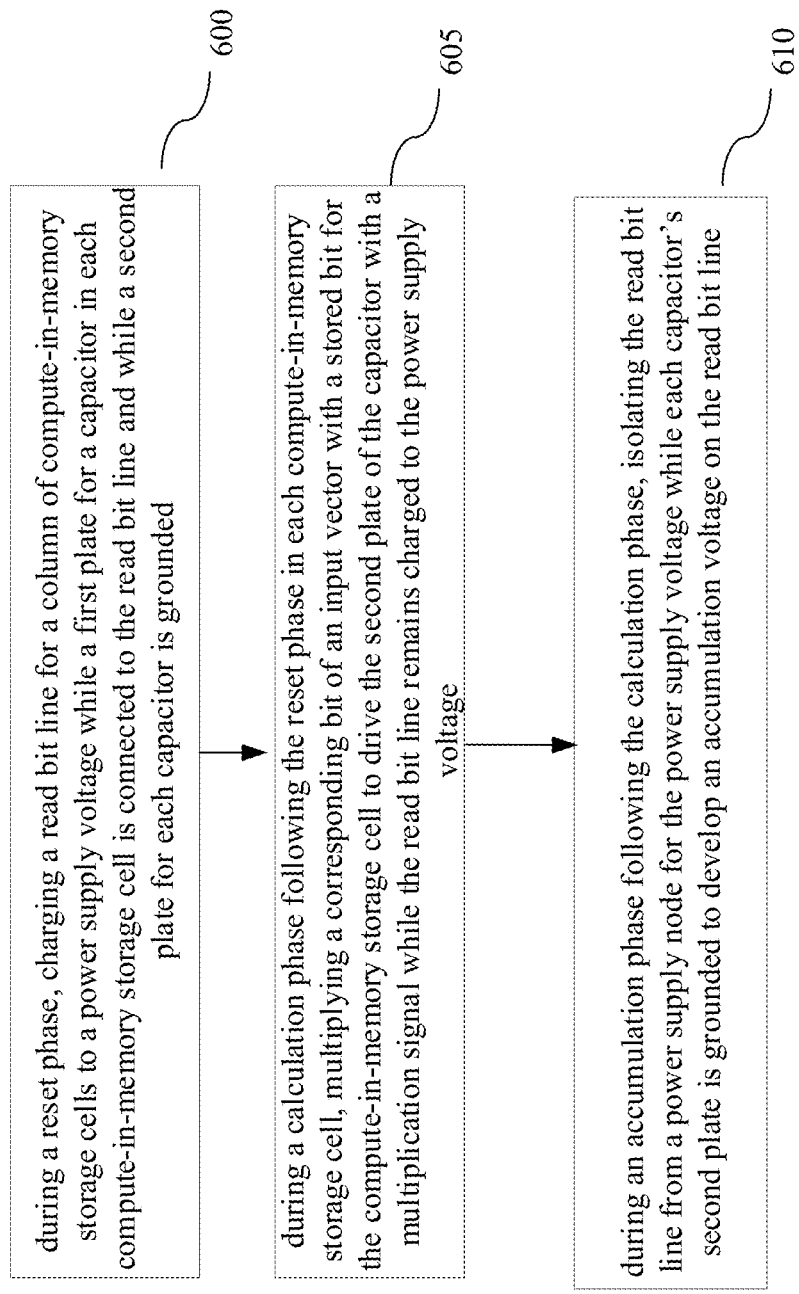
FIG. 6 is a flowchart for an example compute-in-memory method in accordance with an aspect of the disclosure.

A flowchart for an example compute-in-memory method is shown in FIG. 6. The method includes an act 600 that occurs during a reset phase and includes charging a read bit line for a column of compute-in-memory storage cells to a power supply voltage while a first plate for a capacitor in each compute-in-memory storage cell is connected to the read bit line and while a second plate for each capacitor in each compute-in-memory storage cell is grounded. An example of such a reset phase occurs while transistor P4 is on and each read word line is asserted for column 230 of FIG. 2B.

The method also includes an act 605 that occurs during a calculation phase following the reset phase and includes, for each compute-in-memory storage cell, multiplying a corresponding bit of an input vector with a stored bit for the compute-in-memory storage cell to drive the second plate of the compute-in-memory storage cell's capacitor with a multiplication signal while the read bit line remains charged to the power supply voltage. An example of the multiplication signal is the XNOR output signal from pass transistors P1 and P2 in compute-in-memory bitcells 100 and 300 and the XNOR output signal from first transmission gate T1 or from second transmission gate T2 of compute-in-memory bitcells 400 and 500. The multiplication signal is an XOR output signal in XOR logic gate embodiments.

Finally, the method includes an act 610 that occurs during an accumulation phase following the calculation phase. Act 610 includes isolating the read bit line from a power supply node for the power supply voltage while the second plate of each compute-in-memory storage cell's capacitor is grounded to develop an accumulation voltage on the read bit line. An example of the accumulation voltage is the read bit line voltage for any of compute-in-memory bitcells 100, 300, 400, or 500 after transistor P4 is switched off and reset transistor M3 is switched on following the calculation phase.

Figure 7:
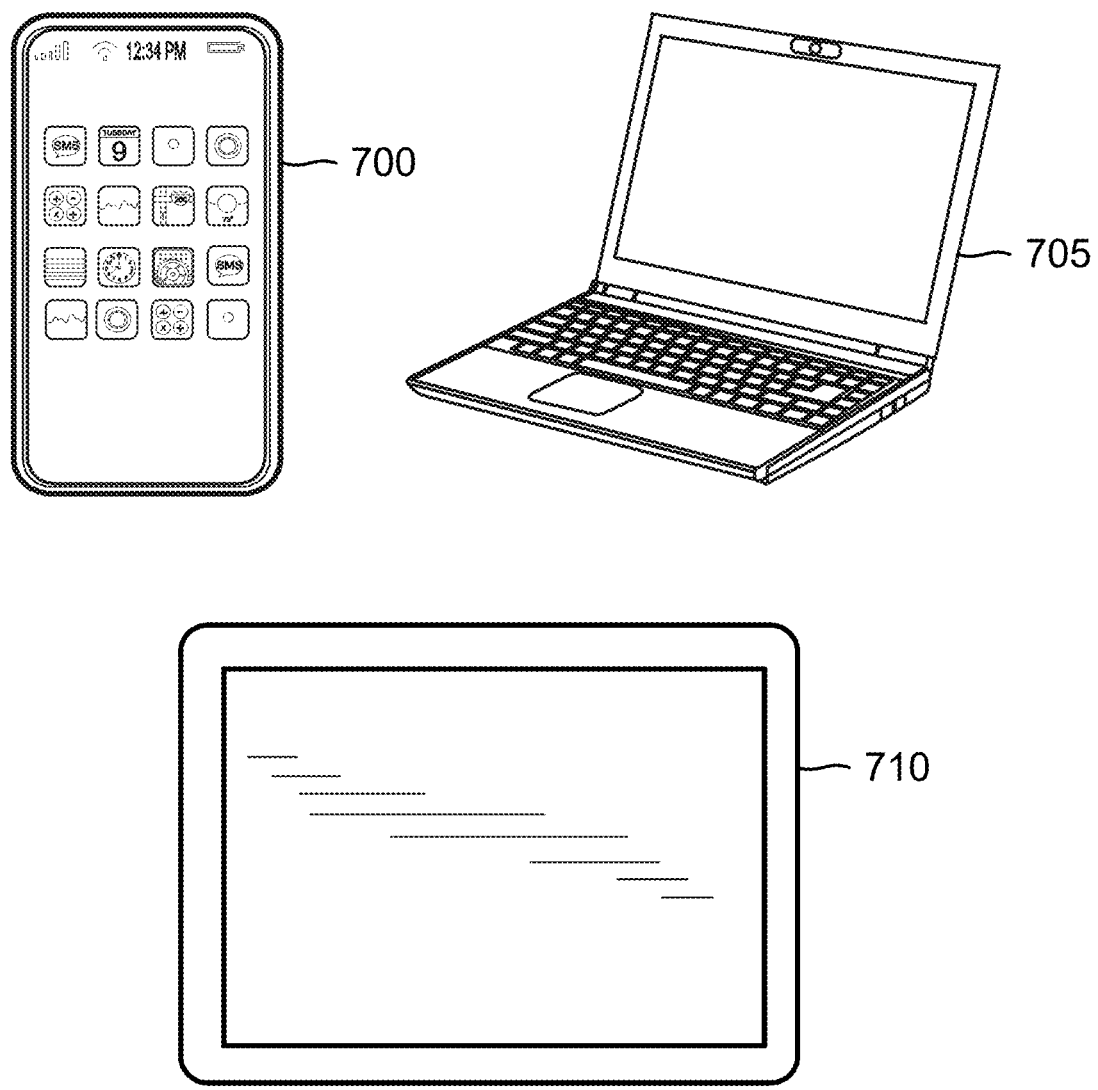
FIG. 7 illustrates some example electronic systems each incorporating a multiply-and-accumulate circuit having an array of compute-in-memory bitcells in accordance with an aspect of the disclosure.

A compute-in-memory bitcell as disclosed herein may be advantageously incorporated in any suitable mobile device or electronic system. For example, as shown in FIG. 7, a cellular telephone 700, a laptop computer 705, and a tablet PC 710 may all include a compute-in-memory having compute-in-memory bitcells such as for machine learning applications in accordance with the disclosure. Other exemplary electronic systems such as a music player, a video player, a communication device, and a personal computer may also be configured with compute-in-memories constructed in accordance with the disclosure.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A compute-in-memory storage cell, comprising:
a pair of cross-coupled inverters having a first output node for a stored bit;
a read bit line;
a word line having a voltage responsive to an input bit;
a capacitor having a first plate connected to the read bit line; and
a first pass transistor connected between the first output node and a second plate of the capacitor and having a gate connected to the word line,
wherein the pair of cross-coupled inverters include a second output node for a complement of the stored bit the compute-in-memory storage cell further comprising:
a complement word line having a voltage responsive to a complement of the input bit;
a second pass transistor connected between the second output node and the second plate of the capacitor and having a gate connected to the complement word line.

2. The compute-in-memory storage cell of claim 1, wherein the first pass transistor and the second pass transistor are both p-type metal-oxide semiconductor (PMOS) transistors.

3. The compute-in-memory storage cell of claim 1, further comprising:
a read word line; and
a third transistor connected between the second plate of the capacitor and ground and having a gate connected to the read word line.

4. The compute-in-memory storage cell of claim 3, wherein the third transistor is an n-type metal-oxide semiconductor (NMOS) transistor having a source connected to ground and a drain connected to the second plate of the capacitor.

5. The compute-in-memory storage cell of claim 3, further comprising:
a fourth transistor connected between a power supply node for a power supply voltage and the read bit line.

6. The compute-in-memory storage cell of claim 5, wherein the fourth transistor is a PMOS transistor having a source connected to the power supply node and a drain connected to the read bit line.

7. The compute-in-memory storage cell of claim 6, further comprising:
a reset line for a reset signal, wherein a gate for the fourth transistor is connected to the reset line.

8. The compute-in-memory storage cell of claim 1, further comprising:
a write bit line;
a complement write bit line:
a first access transistor connected between the write bit line and the first output node; and
a second access transistor connected between the complement write bit line and the second output node.

9. The compute-in-memory storage cell of claim 8, further comprising:
a write word line, wherein the write word line is connected to a gate of the first access transistor and is connected to a gate of the second access transistor.

10. The compute-in-memory storage cell of claim 5, further comprising a fifth transistor connected between the second plate of the capacitor and the power supply node.

11. The compute-in-memory storage cell of claim 1, wherein the compute-in-memory storage cell is included within a column in an array of compute-in-memory storage cells.

12. The compute-in-memory storage cell of claim 1, wherein the capacitor is selected from the group consisting of a metal-layer capacitor, a varactor, and a metal-insulator-metal capacitor.

13. The compute-in-memory storage cell of claim 4, wherein the third transistor is a thick-oxide transistor.

14. A compute-in-memory storage cell, comprising:
a pair of cross-coupled inverters having a first output node for a stored bit;
a read bit line;
a capacitor having a first plate connected to the read bit line;
a first transmission gate connected between the first output node and a second plate of the capacitor, wherein the first transmission gate is configured to close in response to an input bit being true and is configured to open in response to the input bit being false;
a read word line; and
a first transistor connected between the second plate of the capacitor and ground and having a gate connected to the read word line.

15. The compute-in-memory storage cell of claim 14, wherein the pair of cross-coupled inverters include a second output node for a complement of the stored bit; the compute-in-memory storage cell further comprising:
a second transmission gate connected between the second output node and the second plate of the capacitor, wherein the second transmission gate is configured to open in response to the input bit being true and is configured to close in response to the input bit being false.

16. The compute-in-memory storage cell of claim 14, wherein the input bit is an active-low signal.

17. The compute-in-memory storage cell of claim 14, wherein the first transistor is a n-type metal-oxide semiconductor (NMOS) transistor having a source connected to ground and a drain connected to the second plate of the capacitor.

18. The compute-in-memory storage cell of claim 14, further comprising:
a second transistor connected between a power supply node for a power supply voltage and the read bit line.

19. The compute-in-memory storage cell of claim 18, wherein the second transistor is a PMOS transistor having a source connected to the power supply node and a drain connected to the read bit line.

20. The compute-in-memory storage cell of claim 19, further comprising:
a reset line for a reset signal, wherein a gate for the second transistor is connected to the reset line.

* * * * *